United States Patent
Ottlinger et al.

(12) 
(10) Patent No.: US 10,608,161 B2
(45) Date of Patent: Mar. 31, 2020

(54) METHOD FOR MANUFACTURING MULTILAYER COMPONENTS, AND MULTILAYER COMPONENT

(71) Applicant: EPCOS AG, München (DE)

(72) Inventors: Marion Ottlinger, Deutschlandsberg (DE); Ivan Jagust, Zagreb (HR)

(73) Assignee: EPCOS AG, Munich (DE)

( * ) Notice: Subject to any disclaimer, the term of this patent is extended or adjusted under 35 U.S.C. 154(b) by 291 days.

(21) Appl. No.: 15/549,427

(22) PCT Filed: Feb. 11, 2016

(86) PCT No.: PCT/EP2016/052927
§ 371 (c)(1),
(2) Date: Aug. 8, 2017

(87) PCT Pub. No.: WO2016/134978
PCT Pub. Date: Sep. 1, 2016

(65) Prior Publication Data
US 2018/0026174 A1    Jan. 25, 2018

(30) Foreign Application Priority Data

Feb. 25, 2015   (DE) .................. 10 2015 102 713

(51) Int. Cl.
*H01L 41/22* (2013.01)
*H01L 41/083* (2006.01)
(Continued)

(52) U.S. Cl.
CPC ........ *H01L 41/0533* (2013.01); *H01L 41/083* (2013.01); *H01L 41/23* (2013.01);
(Continued)

(58) Field of Classification Search
CPC ..... H01L 41/053; H01L 41/083; H01L 41/23; H01L 41/293; H01L 41/332; H01L 41/338; H01L 41/273
(Continued)

(56) References Cited

U.S. PATENT DOCUMENTS 5,233,260 A    8/1993  Harada et al.
8,129,682 B2 *  3/2012  Meinel ............... G01J 5/12
                                          250/339.01
(Continued)

FOREIGN PATENT DOCUMENTS

DE         10231624 A1   1/2004
DE      102012101351 A1   8/2013
(Continued)

*Primary Examiner* — Thomas M Dougherty
(74) *Attorney, Agent, or Firm* — Slater Matsil, LLP

(57) ABSTRACT

A method for manufacturing multilayer components, and a multilayer component are disclosed. The method includes manufacturing a body comprising electrically conductive layers and dielectric layers which are stacked one above the other, wherein the body comprises at least one cavity and at least partially filling the cavity with an insulation material using capillary forces. The method further includes after partially filling the cavity, singulating the body into at least two base bodies and applying a passivation layer to surfaces of the singulated base bodies, wherein the passivation layer comprises a material which is different from the insulation material.

11 Claims, 3 Drawing Sheets

(51) Int. Cl.
  *H01L 41/053* (2006.01)
  *H01L 41/273* (2013.01)
  *H01L 41/332* (2013.01)
  *H01L 41/338* (2013.01)
  *H01L 41/293* (2013.01)
  *H01L 41/23* (2013.01)

(52) U.S. Cl.
  CPC .......... *H01L 41/273* (2013.01); *H01L 41/293* (2013.01); *H01L 41/332* (2013.01); *H01L 41/338* (2013.01)

(58) Field of Classification Search
  USPC .................. 310/311, 366; 29/25.35
  See application file for complete search history.

(56) References Cited

U.S. PATENT DOCUMENTS

2004/0075369 A1  4/2004  Leo et al.
2015/0042212 A1  2/2015  Somitsch et al.
2015/0325781 A1  11/2015  Rinner et al.

FOREIGN PATENT DOCUMENTS

| | | |
|---|---|---|
| DE | 102012105287 A1 | 12/2013 |
| EP | 1942533 A1 | 7/2008 |
| EP | 2530756 A1 | 12/2012 |
| JP | H02284433 A | 11/1990 |
| JP | H02284483 A | 11/1990 |
| JP | H04273485 A | 9/1992 |
| JP | 2001313428 A | 11/2001 |
| JP | 2004119856 A | 4/2004 |
| JP | 2007150200 A | 6/2007 |
| JP | 2009267114 A | 11/2009 |
| JP | 2011176343 A | 9/2011 |
| JP | 2011258681 A | 12/2011 |
| JP | 2015513789 A | 5/2015 |
| WO | 2011093293 A1 | 8/2011 |
| WO | 2013124146 A1 | 8/2013 |
| WO | 2013189671 A1 | 12/2013 |

* cited by examiner

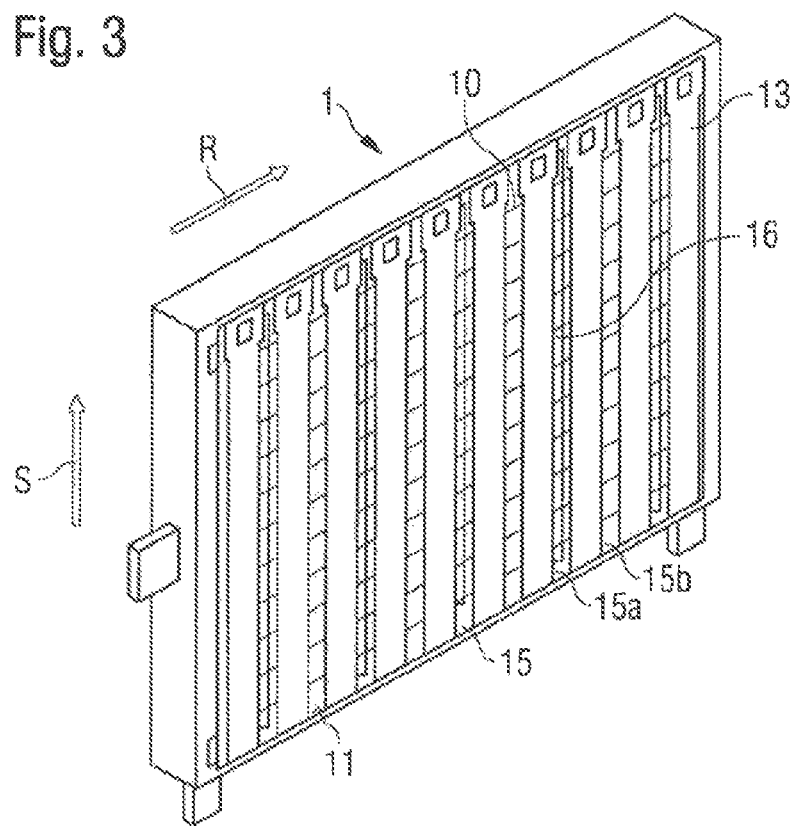
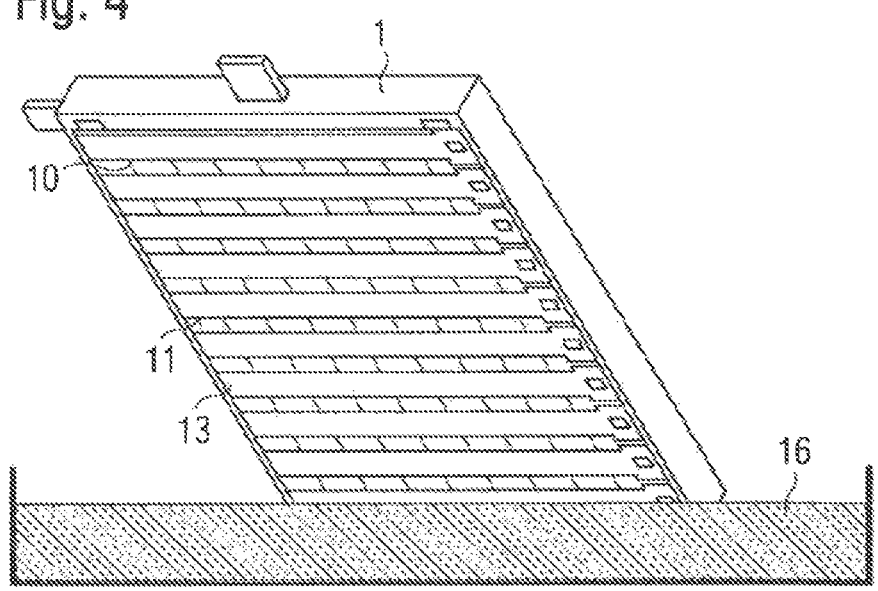

METHOD FOR MANUFACTURING MULTILAYER COMPONENTS, AND MULTILAYER COMPONENT

This patent application is a national phase filing under section 371 of PCT/EP2016/052927, filed Feb. 11, 2016, which claims the priority of German patent application 10 2015 102 713.5, filed Feb. 25, 2015, each of which is incorporated herein by reference in its entirety.

TECHNICAL FIELD

The present application relates to a method for manufacturing multilayer electrical components, and to a multilayer component. For example, the multilayer component is configured as a piezoelectric actuator which may be used for actuating an injector in a motor vehicle.

BACKGROUND

From the publication DE 102012105287 A1, a method for manufacturing such a multilayer component is known, in which an insulation zone is filled with insulation material using the capillary effect.

SUMMARY OF THE INVENTION

Embodiments provide an improved method for manufacturing multilayer components, and provide a multilayer component having improved characteristics.

In various embodiments a method for manufacturing multilayer components is provided, in which a body is initially manufactured which comprises electrically conductive layers and dielectric layers stacked one above the other, wherein the body comprises at least one cavity. In an additional method step, the cavity is at least partially filled with an insulation material using capillary forces. In an additional method step, the body is singulated into at least two base bodies. The step of singulation is carried out only after at least partially filling the cavities. Furthermore, a passivation layer is applied to the surfaces of the singulated base bodies, wherein the passivation layer comprises a material which is different from the insulation material.

In various further embodiments the multilayer components manufactured via this method accordingly comprise a base body which comprises electrically conductive layers and dielectric layers which are stacked one above the other, and cavities which are at least partially filled with insulation material. Furthermore, the multilayer components comprise a passivation layer which covers surfaces of the base body, the material of said passivation layer differing from the insulation material.

In the manufacturing method known from the prior art, the body was initially singulated into multilayer components, and the cavities were only subsequently filled with insulation material.

During singulation, the body is sawed. This sawing is carried out in dicing water to which certain additives are added. If the step of singulation is carried out before filling the cavities, the dicing water may enter the cavities during the singulation. In particular, the additives remain in the cavities and can hardly be removed from them subsequently. The additives in the finished multilayer component cause a degradation of the electrical characteristics of this multilayer component.

If, as proposed according to embodiments of the present invention, the cavity is filled with insulation material before the singulation, it is prevented that dicing water is able to enter the cavities during the singulation. Accordingly, the additives contained in the dicing water are no longer able to accumulate in the cavities in the base body and accordingly no longer degrade the electrical characteristics of the multilayer component. The method described here thus results in multilayer components having improved electrical characteristics.

The singulation of the body into base bodies may furthermore cause the formation of numerous sharp edges as the result of singulation by means of sawing. These edges are highly susceptible to mechanical damage. It is therefore also generally preferable to carry out as many steps of the manufacturing method as possible on the body in which numerous multilayer components are combined, in order to keep the risk of damage to the sharp edges as low as possible.

In addition, the effort in handling such a body is considerably less than is the case for singulated multilayer components, which would require handling as individual parts.

An additional advantage of the method is that it allows freely choosing the material of the insulation material. The method can ensure that the insulation material is arranged only in the filled cavities.

According to embodiments of the method described here, the insulation material and the passivation layer are applied in two separate method steps. Accordingly, it is not required to use the same material for the insulation material and the material of the passivation layer. Rather, the method according to embodiments of the present invention allows choosing a material for each of the two layers which is adapted to the respective requirements.

Here, the insulation material may be chosen in such a way that it demonstrates excellent flow characteristics, since it is to enter very thin cavities, the expansion of which may be the range of a few micrometers. For this purpose, for example, a soft, low-viscosity elastomer is suitable. The insulation material may contain no solvents and no inorganic fillers. Furthermore, the material may demonstrate a high dielectric strength.

The passivation layer which is applied to active side faces of a base body may in particular be characterized by a high dielectric strength, since the passivation must prevent damage and/or failure of the multilayer component.

The material of the passivation layer may demonstrate limited flowability in order to make it possible to keep the geometric requirements imposed on the multilayer component within narrow tolerances. In addition, this material may demonstrate a minimum hardness in order to facilitate the transportability and the handling of the multilayer component.

The requirements placed on the materials of the passivation layer and the insulation materials are thus sometimes opposite, in particular, with respect to the flow characteristics of the respective material. Therefore, different materials are used for the insulation material and the material of the passivation layer.

In the body, the electrically conductive layers and dielectric layers may be stacked one above the other in a stack direction, wherein the cavities extend in a direction perpendicular to the stack direction. In particular, the cavities may be arranged on outer faces of the body. The cavities may run along the electrically conductive layers and cover one end of the electrically conductive layers.

Before filling the cavities with the insulation material, one outer contact may be applied in each case to a first and a second outer face for each multilayer component on the body, said outer contact partially covering the cavity and extending in a stack direction. These outer contacts may be used for contacting the electrically conductive layers.

A gap may remain in each case between two outer contacts which are arranged adjacently on the body, wherein in the method step "filling the cavity with insulating material," insulation material may be applied to each second gap in the stack direction.

By applying the insulation material to each second gap in a targeted manner, a rapid infiltration of the insulation material into the cavities may be made possible using the capillary forces. In this case, the insulation material may be drawn into the respective cavities from the gaps filled with insulation material. Simultaneously, air may escape from the cavities into the gaps which are not filled with insulation material. In this way, the retention of air bubbles in the cavities is prevented. Thus, uniform filling of the cavities may be made possible. In particular, this way of filling may result in a rapid filling time. The corresponding method step may be carried out in less than 20 minutes. The step may be carried out separately for each of the two outer sides, wherein a process step duration of less than 20 minutes is incurred in each case.

Furthermore, the outer contact may be used as a barrier. It may in particular prevent the insulation material from flowing into areas of the multilayer component in which it is undesirable. The outer contact may also prevent the insulation material from reaching the opposite side of the base body.

The insulation material may be a silicone elastomer which is free of fillers. In particular, the insulation material may be free of inorganic fillers. This insulation material meets the aforementioned requirements placed on the insulation material particularly well, and is characterized by its low viscosity.

The passivation layer may comprise a silicone elastomer which comprises an inorganic filler. The filler may be silicon oxide. The inorganic filler may have a component of the material of the passivation layer of between 30 and 70% by weight, preferably between 40 and 60% by weight. If the passivation layer is made up of the silicone elastomer including inorganic filler, it is characterized by a viscosity which makes it possible to meet the aforementioned requirements very well. In addition, it is characterized by a high dielectric strength. The filler may be silicon oxide.

The cavity may be adjacent to an electrically conductive layer and thus cover one end of the electrically conductive layer. Accordingly, the cavity which is filled with insulation material may be used for insulating the respective electrically conductive layer from an external contact.

An additional aspect of embodiments of the present invention relates to a multilayer component. In this case, it may be a multilayer component which is manufactured using the above-described method. Accordingly, each structural and/or functional feature which has been described with respect to the method may also apply to the multilayer component and vice-versa.

A multilayer component is provided which comprises a base body having electrically conductive layers and dielectric layers which are arranged one above the other, wherein the base body furthermore comprises a cavity which is at least partially filled with an insulation material, and wherein the multilayer component comprises a passivation layer which at least partially covers the base body and which comprises a material which is different from the insulation material.

As already explained with respect to the method, it is advantageous to choose a material for the passivation layer which differs from the insulation material, since different, sometimes even opposite requirements are placed on these two materials.

Furthermore, the multilayer component may comprise an outer contact which is arranged on an outer face of the multilayer component, wherein the insulation material is arranged between the electrically conductive layer and the outer contact, and wherein the passivation layer covers surfaces of the multilayer component which are free of the outer contact. Accordingly, the surface of the base body may be covered at every area either by the passivation layer or the outer contact.

The passivation layer may comprise a silicone elastomer which comprises an inorganic filler, and the insulation material may be a silicone elastomer which is free of fillers.

BRIEF DESCRIPTION OF THE DRAWINGS

The multilayer component and the manufacturing method will be described in greater detail based on schematic figures which are not true to scale.

FIG. 3 shows the body at a yet later method step.

FIG. 4 shows an alternative method step to the one shown in FIG. 3.

DETAILED DESCRIPTION OF ILLUSTRATIVE EMBODIMENTS

Figure 1:
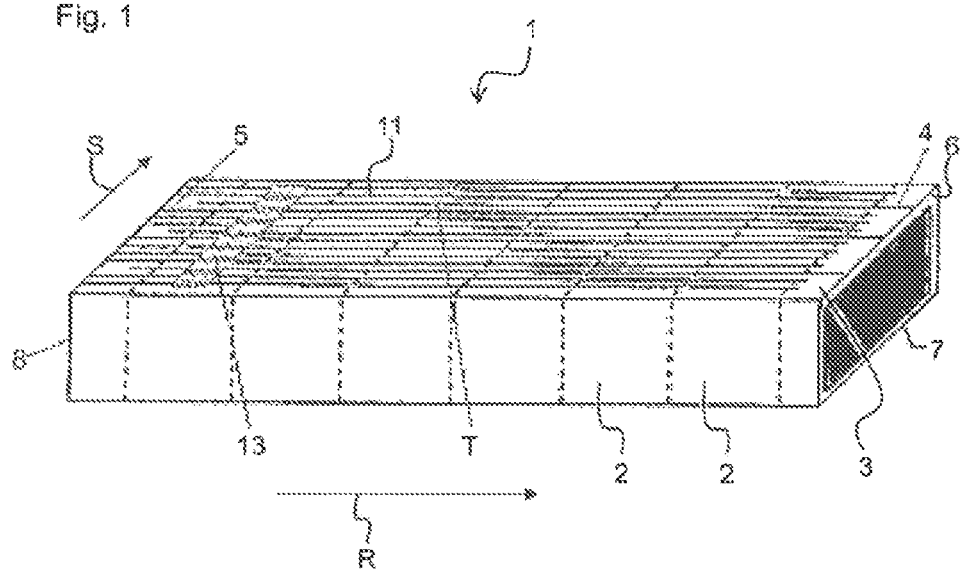
FIG. 1 shows a perspective view of a body from which multilayer components are manufactured, at a first stage of the method.

A method for manufacturing multilayer components will be described below. FIG. 1 shows a body 1 which is singulated into a plurality of multilayer components in a later method step.

The body 1 shown in FIG. 1 is configured as a bar and may later be divided along the plotted dividing lines T into multiple base bodies 2 for multilayer components. For example, the multilayer components are configured as piezoelectric actuators.

The body 1, and thus also the base bodies 2 later formed from them, comprise dielectric layers 3 which are arranged one above the other along a stack direction S. First and second conductive layers 4, 5 are arranged between the dielectric layers 3. The dielectric layers 3 contain, for example, a ceramic material.

Preferably, the dielectric layers 3 are configured as piezoelectric layers; in particular, they may comprise a piezoelectric material.

In the method state shown in FIG. 1, the body 1 is already sintered. Particularly preferably, the body 1 is a monolithic sintered body, so that the conductive layers 4, 5 are sintered along with the dielectric layers 3. In an alternative exemplary embodiment, the depicted body 1 is in the green state.

The first conductive layers 4 are arranged alternately with the second conductive layers 5 along the stack direction S. The first conductive layers 4 extend up to a third side face 6, while the second conductive layers 5 are at a distance from the third side face 6. A first auxiliary electrode 7 is arranged on the third side face 6 and is contacted to the first conductive layers 4. The second conductive layers 5 extend up to the fourth side face 8, while the first conductive layers 4 are at a distance from the fourth side face 8. A second auxiliary electrode is arranged on the fourth side face 8 and is electrically contacted to the second conductive layers 5.

The conductive layers 4, 5 contain a metal. Particularly preferably, the conductive layers 4, 5 contain copper or are made of copper. In additional embodiments, the conductive layers 4, 5, for example, may contain silver or silver-palladium.

Furthermore, an outer contact 13 for one of the base bodies 2 is indicated in FIG. 1, but is not yet applied to the body 1 at this stage of the method.

Figure 2:
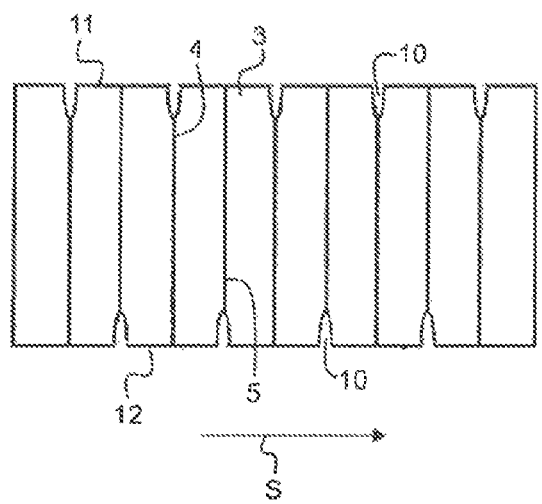
FIG. 2 shows a cross section through the body at a later stage of the method.

In a following method step, material of the conductive layers 4, 5 is removed, so that cavities 10 are formed which extend in a direction R perpendicular to the stack direction S. FIG. 2 shows a cross section of the body 1 along a dividing line T, after carrying out this method step.

The material removal is, for example, carried out via an electrically controlled etching process. In this case, a current is applied selectively via the first auxiliary electrode 7 to the first conductive layers 4, or via the second auxiliary electrode to the second electrically conductive layers 5, and the layers are immersed in a chemical etching solution, for example, $Na_2S_2O_8$, so that the electrodes, for example, Cu electrodes, dissolve from the respective conductive layers 4, 5. The etching process is carried out on the body 1 before it is singulated in a later method step.

During the etching process, areas of the first conductive layers 4 on a first side face 11 of the body 1 are removed, so that cavities 10 are formed here. Furthermore, during the selective etching process, areas of the second conductive layers 5 on a second side face 12 of the body 1 are removed, so that cavities 10 are formed here. The cavities 10 may have a width of between 3 µm and 5 µm in the stack direction S.

In an additional method step, first outer contacts 13 are arranged on the first side face 11 of the body 1, and second outer contacts are arranged on the second side face 12 of the body 1. The second side face 12 is opposite the first side face 11. The outer contacts 13 are applied in such a way that each of the base bodies 2 into which the body 1 is later singulated comprises a first outer contact 13 on the first side face 11 and a second outer contact on the second side face 12. In this case, the outer contacts 13 extend in the stack direction S on the respective base bodies 2. A gap 15 which is free of the outer contact 13 remains in each case between two adjacent outer contacts 13.

Accordingly, the outer contacts 13 and the gap 15 alternate in the direction R, perpendicular to the stack direction S.

Each outer contact 13 comprises a sintered base face which in particular may be made up of a sintered silver layer. Furthermore, the outer contact 13 comprises a contact element which is contacted to the sintered base metallization.

FIG. 3 shows the body in a later method step, in which the cavities 10 on the first side face 11 of the body 1 are filled. The body 1 is set on the second side face 12, so that the first side face 11 points away from a subsurface.

On the first side face 11, each second gap 15 is covered by an insulation material 16 in the direction R, perpendicular to the stack direction S. The insulation material 16 is a silicone elastomer which is free of inorganic fillers.

The insulation material 16 is now drawn into the cavities 10 via capillary forces. The insulation material 16 enters the cavity 10 from a first gap 15a, wherein air which is displaced by the introduced insulation material 16 may escape simultaneously in a second gap 15b which is adjacent to the first gap 15a and which is not filled with insulation material 16. In this way, it is prevented that air bubbles remain in the cavities 10. When this process of filling the cavities 10 of the body 1 is concluded, each cavity 10 on the first side face 11 is at least partially filled with insulation material 16. In particular, each cavity 10 may be completely filled with insulation material 16.

Subsequently, the body 1 is turned, so that its first side face 11 now rests on the subsurface. The process step shown in FIG. 3 is now repeated for the second side face 12. Insulation material 16 is in turn applied to every second gap 15 on the second side face 12, in a direction R perpendicular to the stack direction S. The insulation material 16 is drawn into the cavities 10 on the second side face 12 via capillary forces, so that after completing this step, every cavity 10 on the second side face 12 is at least partially, preferably completely, filled with insulation material 16.

FIG. 4 shows an alternative option for the method step shown in FIG. 3 of filling the cavities 10 with insulation material 16 using the capillary forces. In the exemplary embodiment shown in FIG. 4, the third side face 6 of the body 1 is immersed into a basin filled with insulation material 16. Due to the capillary forces, the insulation material 16 rises along the cavities 10 and fills them at least partially.

The advantage of this alternative exemplary embodiment is that it enables filling the first and the second side faces 11, 12 with insulation material 16 in a single method step. However, the process step shown in FIG. 4 requires a longer time for filling the cavities 10, since the insulation material 16 must be moved over a greater distance by the capillary forces. Therefore, the exemplary embodiment of the method shown in FIG. 3 may be carried out more rapidly, even if the first and the second side faces 11, 12 are treated separately in this case.

After filling the cavity 10 with insulation material 16, the insulating material 16 is gelled, for example, at a temperature of between 80° C. and 120° C., preferably at 100° C., for a period of between 10 minutes and 20 minutes, preferably for 15 minutes. As a result of the gelling, the formation of bubbles is prevented. Subsequently, the insulation material 16 is hardened, for example, at a temperature of between 120° C. and 180° C., preferably at 150° C., for a period of between 30 minutes and 120 minutes, preferably for 60 minutes.

After the cavities 10 have been filled with insulating material 16, and additional steps such as gelling and hardening of the insulating material 16 have optionally been carried out, the body 1 is singulated into base bodies 2 along the dividing lines T. In an additional method step, a passivation layer 17 is now applied to the side faces of the base body 2 which are not covered by an outer contact 13. The passivation layer 17 is a silicone elastomer which comprises an inorganic filler.

Figure 5:
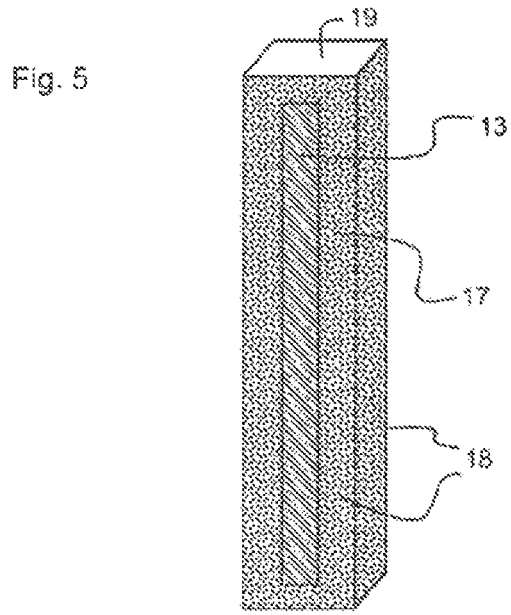
FIG. 5 shows a finished multilayer component.

The multilayer component shown in FIG. 5 then results. As shown in FIG. 5, the active side faces 18 of the multilayer component are covered by the passivation layer 17 in the areas which are not covered by the outer contact 13. The front sides 18 of the multilayer component remain free of passivation. The side faces, the expansion of which changes during the operation of the multilayer component as a piezoelectric actuator, are referred to as active side faces 18. These side faces 18 respectively have surface normals which are perpendicular to the stack direction S. The side faces of the multilayer component, the expansion of which essentially remains unchanged during the operation of the multilayer component as a piezoelectric actuator, are referred to as the front side 19. These front sides 19 respectively have surface normals which point in the direction S.

Figure 6:
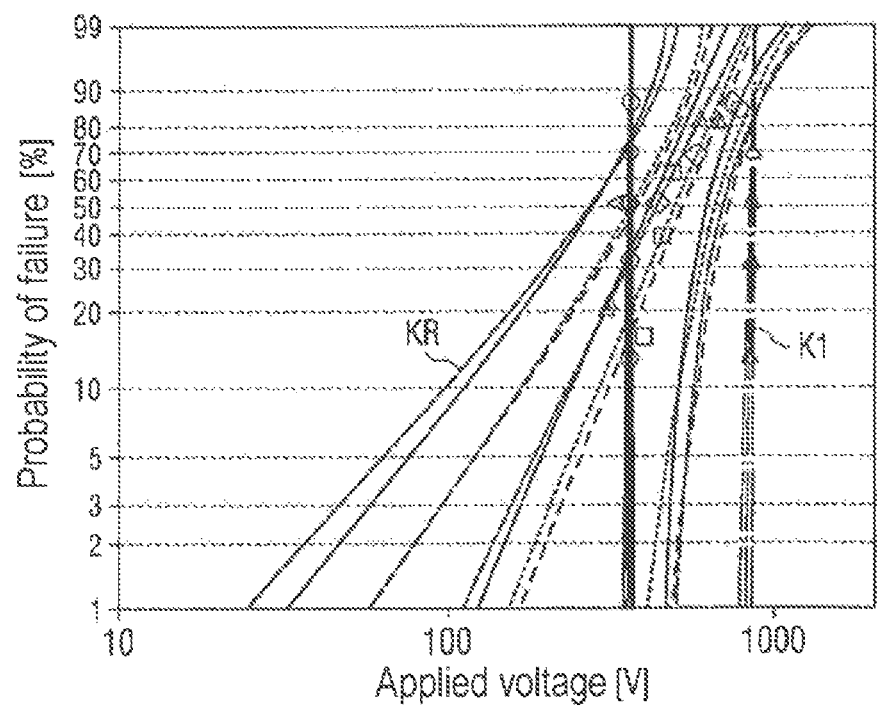
FIG. 6 shows a diagram in which a probability of failure as a result of breakdowns is considered for multilayer components having different material combinations.

FIG. 6 shows a diagram in which the probability of failure as a result of breakdowns is considered for multilayer components having different material combinations for the insulation material 16 and the material of the passivation layer 17. Here, the voltage applied to the multilayer component is plotted logarithmically on the abscissa axis. The probability of failure in percent, which is specified on the ordinate axis, indicates which component of the analyzed multilayer components having the respective material combination fails due to breakdowns at the respective applied voltage. This variable is also plotted logarithmically.

The curve K1 describes the probability of failure for a preferred exemplary embodiment of the multilayer component, in which a silicone elastomer which is free of inorganic fillers is plotted as an insulating material 16, and a silicone elastomer which is displaced at 50% by weight by silicon oxide as a filler is plotted as a material of the passivation layer 17.

The curve KR describes a reference example in which the same material is used for the insulation material 16 and as a material of the passivation layer 17. Here, a silicone elastomer which is free of inorganic fillers was used in each case. FIG. 6 clearly shows that in the preferred exemplary embodiment, failures due to breakdowns occur only at substantially higher applied voltages.

The method described here makes it possible to use a material for the passivation layer 17 which is different from the insulation material 16. In order to be able to use the capillary forces for filling the cavity 10, the insulation material 16 must be of low viscosity, i.e., it must demonstrate high flowability. Since the described method allows using a different material for the passivation layer 17, this limitation does not apply to the passivation layer 17. Accordingly, the material of the passivation layer 17 may be chosen in such a way that it has a high dielectric strength and is thus better able to protect the multilayer component from damage due to breakdowns. Furthermore, the material of the passivation layer 17 may also be optimized for protection from mechanical damage.

The invention claimed is:

1. A method for manufacturing multilayer components, the method comprising:
   manufacturing a body comprising electrically conductive layers and dielectric layers which are stacked one above the other, wherein the body comprises at least one cavity;
   at least partially filling the cavity with an insulation material using capillary forces;
   after partially filling the cavity, singulating the body into at least two base bodies; and
   applying a passivation layer to surfaces of the singulated base bodies, wherein the passivation layer comprises a material which is different from the insulation material.

2. The method according to claim 1, further comprising, prior to partially filling, applying an outer contact in each case to a first side face and a second side face for each base body on the body, the outer contact partially covering the cavity and extending in a stack direction.

3. The method according to claim 2, wherein a gap remains in each case between two adjacent outer contacts, and wherein partially filling comprises applying the insulation material to each second gap, in a stack direction.

4. The method according to claim 1, wherein the insulation material is a silicone elastomer which is free of fillers.

5. The method according to claim 1, wherein the passivation layer comprises a silicone elastomer which comprises an inorganic filler.

6. The method according to claim 1, wherein the cavity is adjacent to an electrically conductive layer and covers one end of the electrically conductive layer.

7. A multilayer component comprising:
   a base body having an electrically conductive layers and dielectric layers which are arranged one above the other, wherein the base body comprises a cavity;
   an insulation material at least partially filling the cavity; and
   a passivation layer at least partially covering the base body and comprising a material which is different from the insulation material.

8. The multilayer component according to claim 7, further comprising an outer contact arranged on a side face of the base body, wherein the insulation material is arranged between an electrically conductive layer and the outer contact, and wherein the passivation layer covers surfaces of the base body which are free of the outer contact.

9. The multilayer component according to claim 7, wherein the passivation layer comprises a silicone elastomer with an inorganic filler.

10. The multilayer component according to claim 7, wherein the insulation material is a silicone elastomer which is free of fillers.

11. A method for manufacturing multilayer components, the method comprising:
    A) manufacturing a body comprising electrically conductive layers and dielectric layers which are stacked one above the other, wherein the body comprises at least one cavity;
    B) at least partially filling the cavity with an insulation material using capillary forces, wherein before step B), one outer contact is applied in each case to a first side face and a second side face for each base body on the body, the outer contact partially covering the cavity and extending in a stack direction, wherein a gap remains in each case between two adjacent outer contacts, and wherein in step B), insulation material is applied to each second gap, in a stack direction;
    C) singulating the body into at least two base bodies, wherein step C) takes place after step B); and
    D) applying a passivation layer to surfaces of the singulated base bodies, wherein the passivation layer comprises a material which is different from the insulation material.

* * * * *